(12) United States Patent
Chi et al.

(10) Patent No.: US 10,333,098 B2
(45) Date of Patent: Jun. 25, 2019

(54) TRANSPARENT OLED DISPLAY PANEL AND MANUFACTURING METHOD THEREOF

(71) Applicant: Wuhan China Star Optoelectronics Semiconductor Display Technology Co., Ltd., Wuhan (CN)

(72) Inventors: Mingming Chi, Wuhan (CN); Lei Pei, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 3 days.

(21) Appl. No.: 15/557,134

(22) PCT Filed: Aug. 18, 2017

(86) PCT No.: PCT/CN2017/098161
§ 371 (c)(1),
(2) Date: Sep. 11, 2017

(87) PCT Pub. No.: WO2018/227754
PCT Pub. Date: Dec. 20, 2018

(65) Prior Publication Data
US 2018/0366678 A1    Dec. 20, 2018

(30) Foreign Application Priority Data

Jun. 15, 2017   (CN) .......................... 2017 1 0453650

(51) Int. Cl.
*H01L 51/52*   (2006.01)
*H01L 51/56*   (2006.01)

(52) U.S. Cl.
CPC ...... *H01L 51/5234* (2013.01); *H01L 51/5209* (2013.01); *H01L 51/5218* (2013.01); *H01L 51/56* (2013.01); *H01L 2251/308* (2013.01)

(58) Field of Classification Search
None
See application file for complete search history.

(56) References Cited

U.S. PATENT DOCUMENTS

| 2007/0029539 | A1  | 2/2007 | Yashima et al. |
| 2017/0110661 | A1* | 4/2017 | Lee .......................... H01L 51/56 |
| 2018/0097195 | A1* | 4/2018 | Inoue ..................... H05B 33/06 |

FOREIGN PATENT DOCUMENTS

| CN | 102163615 A | 8/2011 |
| CN | 103872072 A | 6/2014 |

(Continued)

*Primary Examiner* — Michelle Mandala
(74) *Attorney, Agent, or Firm* — Leong C. Lei

(57) ABSTRACT

The invention provides a transparent OLED display panel and manufacturing method thereof, the OLED display panel comprising: a transparent substrate and a plurality of sub-pixels disposed on the substrate arranged in an array; each sub-pixel comprising: an anode disposed on the substrate, an organic light-emitting layer disposed on the anode, and a transparent cathode disposed on the organic light-emitting layer; the anode comprising: a first transparent electrode, a reflective electrode stacked on the first transparent electrode, a second transparent electrode stacked on the reflective electrode, the reflective electrode forming a hollow area at the center; through forming hollow area on the reflective electrode of the anode, the light can be emitted simultaneously for the cathode and the hollow area to achieve transparent display with a simple and stable structure, high yield rate and low production cost.

11 Claims, 5 Drawing Sheets

(56) References Cited

FOREIGN PATENT DOCUMENTS

| | | |
|---|---|---|
| CN | 104485346 A | 4/2015 |
| CN | 104795434 A | 7/2015 |
| CN | 104885250 A | 9/2015 |
| CN | 105789260 A | 7/2016 |

* cited by examiner

TRANSPARENT OLED DISPLAY PANEL AND MANUFACTURING METHOD THEREOF

BACKGROUND OF THE INVENTION

1. Field of the Invention

The present invention relates to the field of display techniques, and in particular to a transparent OLED display panel and manufacturing method thereof.

2. The Related Arts

The organic light-emitting diode (OLED) display technology is a highly promising panel display technology, as the OLED has a very excellent display performance, such as, active-luminous, simple structure, ultra-thin, fast response, wide viewing angle, low power consumption and ability to achieve flexible display, and so on, and is known as the "dream display". Thus, the OLED has attracted the major display manufacturers and has become the mains technology in the field of the third generation display device.

The OLED display is an active light-emitting display device, usually comprises a pixel electrode (used as anode), a common electrode (used as cathode), and an organic light-emitting layer disposed between the element electrode and the common electrode, so that the organic light emitting layer emits light when an appropriate voltage is applied to the anode and cathode. The organic light-emitting layer comprises a hole injection layer disposed on the anode, a hole transport layer disposed on the hole injection layer, a light-emitting layer disposed on the hole transport layer, an electron transport layer disposed on the light-emitting layer, an electron injection layer disposed on the electron transport layer. The light-emission principle behind the OLED display device is as follows: under certain voltage driving, electrons and holes are injected from the cathode and the anode into the electron injection layer and the hole injection layer respectively. The electrons and the holes migrate through the electron transport layer and the hole transport layer to the light emitting layer respectively, and meet in the light emitting layer to form excitons to cause the light emitting molecules to excite, and the latter emits visible light by radiation relaxation.

A transparent display generally refers to a display that can form a transparent display state so that the viewer can see the image displayed in the display and the scene behind the display. The transparent displays provide many possible applications, such as, windows for buildings or cars and shopping windows for shopping malls. In addition to the use of these large devices, small devices such as handheld computers can also benefit from transparent displays, such as, enabling users to view the map and be able to view the front view through the screen.

The OLED display device is currently one of the most suitable for the production of transparent display, but the conventional top-emitting OLED display panel, usually using the micro-cavity resonance principle in the anode to manufacture a layer of metal reflective layer (usually silver), that is, using a sandwich structure with two layers of transparent material (usually indium tin oxide, ITO) and a layer of metal material in-between to improve the reflectivity of the anode. However, to ensure the high reflectivity usually requires a thicker metal reflective layer, and the light from the organic light-emitting layer is unable to penetrate, and unable to achieve transparency display.

SUMMARY OF THE INVENTION

The object of the present invention is to provide a transparent OLED display panel, with a simple and stable structure, high yield rate and low production cost.

Another object of the present invention is to provide a manufacturing method of transparent OLED display panel, able to simplify the production process of transparent OLED display device, improve yield rate of the transparent OLED display device, and reduce the production cost of transparent OLED display device.

To achieve the above object, the present invention provides a transparent OLED display panel, comprising: a transparent substrate and a plurality of sub-pixels disposed on the substrate arranged in an array;

each sub-pixel comprising: an anode disposed on the substrate, an organic light-emitting layer disposed on the anode, and a transparent cathode disposed on the organic light-emitting layer;

the anode comprising: a first transparent electrode, a reflective electrode stacked on the first transparent electrode, a second transparent electrode stacked on the reflective electrode, the reflective electrode forming a hollow area at the center.

According to a preferred embodiment of the present invention, the first transparent electrode and the second transparent electrode are made of ITO, and the reflective electrode is made of silver.

According to a preferred embodiment of the present invention, the hollow area has a round, rectangular, or centrically-symmetric polygon shape.

According to a preferred embodiment of the present invention, the hollow area has a size smaller than or equal to 1/3 of the area of the sub-pixel.

According to a preferred embodiment of the present invention, the plurality of sub-pixels comprises: at least two different colors of sub-pixels, area ration between the hollow areas of the at least two different colors of sub-pixels is equal to the area ratio between the areas of the at least two different colors of sub-pixels.

The present invention also provides a manufacturing method of transparent OLED display panel, comprising the steps of: providing a transparent substrate, forming a plurality of first transparent electrodes on the substrate arranged in an array; forming a reflective electrode film on the plurality of first transparent electrodes and the substrate, patternizing the reflective electrode film to form a plurality of reflective electrodes respectively stacked on the plurality of first transparent electrode, and a plurality of hollow areas located at center of each of the plurality of reflective electrodes; forming a second transparent electrode on the each reflective electrode and the hollow area corresponding to the reflective electrodes to obtain a plurality of anodes; forming an organic light-emitting layer and a transparent cathode on each anode to obtain a plurality of sub-pixels.

According to a preferred embodiment of the present invention, the first transparent electrode and the second transparent electrode are made of ITO, and the reflective electrode is made of silver.

According to a preferred embodiment of the present invention, the hollow area has a round, rectangular, or centrically-symmetric polygon shape.

According to a preferred embodiment of the present invention, the hollow area has a size smaller than or equal to ⅓ of the area of the sub-pixel.

According to a preferred embodiment of the present invention, the plurality of sub-pixels comprises: at least two different colors of sub-pixels, area ration between the hollow areas of the at least two different colors of sub-pixels is equal to the area ratio between the areas of the at least two different colors of sub-pixels.

The present invention also provides a transparent OLED display panel, comprising: a transparent substrate and a plurality of sub-pixels disposed on the substrate arranged in an array; each sub-pixel comprising: an anode disposed on the substrate, an organic light-emitting layer disposed on the anode, and a transparent cathode disposed on the organic light-emitting layer; the anode comprising: a first transparent electrode, a reflective electrode stacked on the first transparent electrode, a second transparent electrode stacked on the reflective electrode, the reflective electrode forming a hollow area at the center;

wherein the first transparent electrode and the second transparent electrode being made of ITO, and the reflective electrode being made of silver;

wherein the hollow area having a round, rectangular, or centrically-symmetric polygon shape;

wherein the hollow area having a size smaller than or equal to ⅓ of the area of the sub-pixel;

wherein, the plurality of sub-pixels comprising: at least two different colors of sub-pixels, area ration between the hollow areas of the at least two different colors of sub-pixels being equal to the area ratio between the areas of the at least two different colors of sub-pixels.

Compared to the known techniques, the present invention provides the following advantages. The present invention provides a transparent OLED display panel, comprising: a transparent substrate and a plurality of sub-pixels disposed on the substrate arranged in an array; each sub-pixel comprising: an anode disposed on the substrate, an organic light-emitting layer disposed on the anode, and a transparent cathode disposed on the organic light-emitting layer; the anode comprising: a first transparent electrode, a reflective electrode stacked on the first transparent electrode, a second transparent electrode stacked on the reflective electrode, the reflective electrode forming a hollow area at the center; through forming hollow area on the reflective electrode of the anode, the light can be emitted simultaneously for the cathode and the hollow area to achieve transparent display with a simple and stable structure, high yield rate and low production cost. The present invention also provides a manufacturing method of transparent OLED display panel, able to simplify the production process of transparent OLED display device, improve yield rate of the transparent OLED display device, and reduce the production cost of transparent OLED display device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
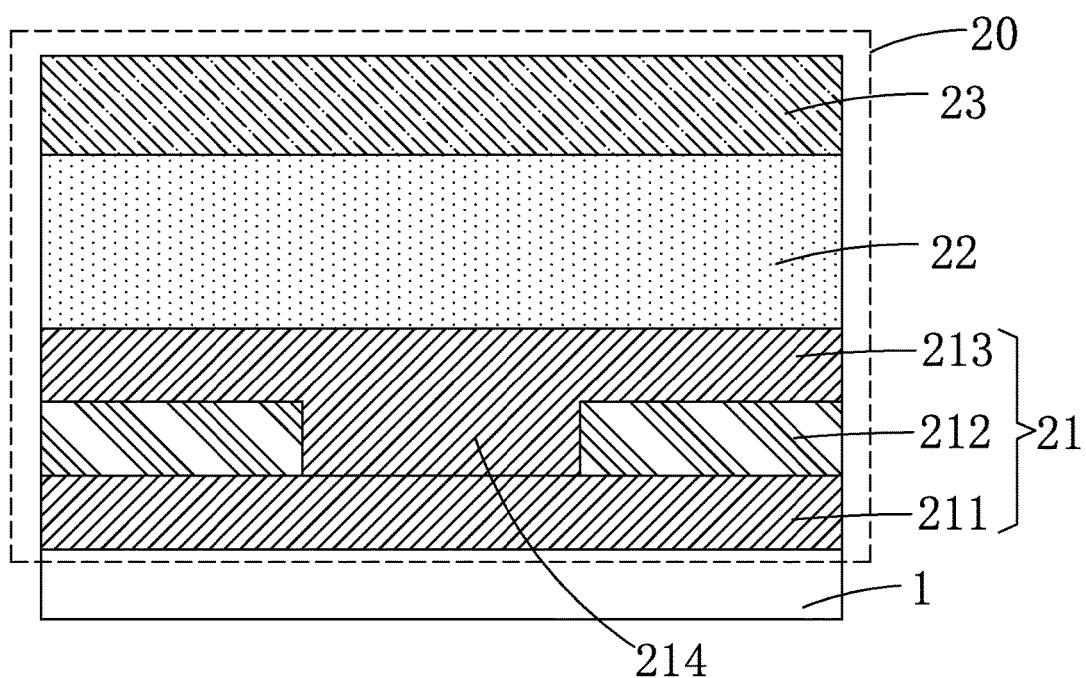
FIG. 1 is a cross-sectional view showing a transparent OLED display panel provided by an embodiment of the present invention.
Figure 2:
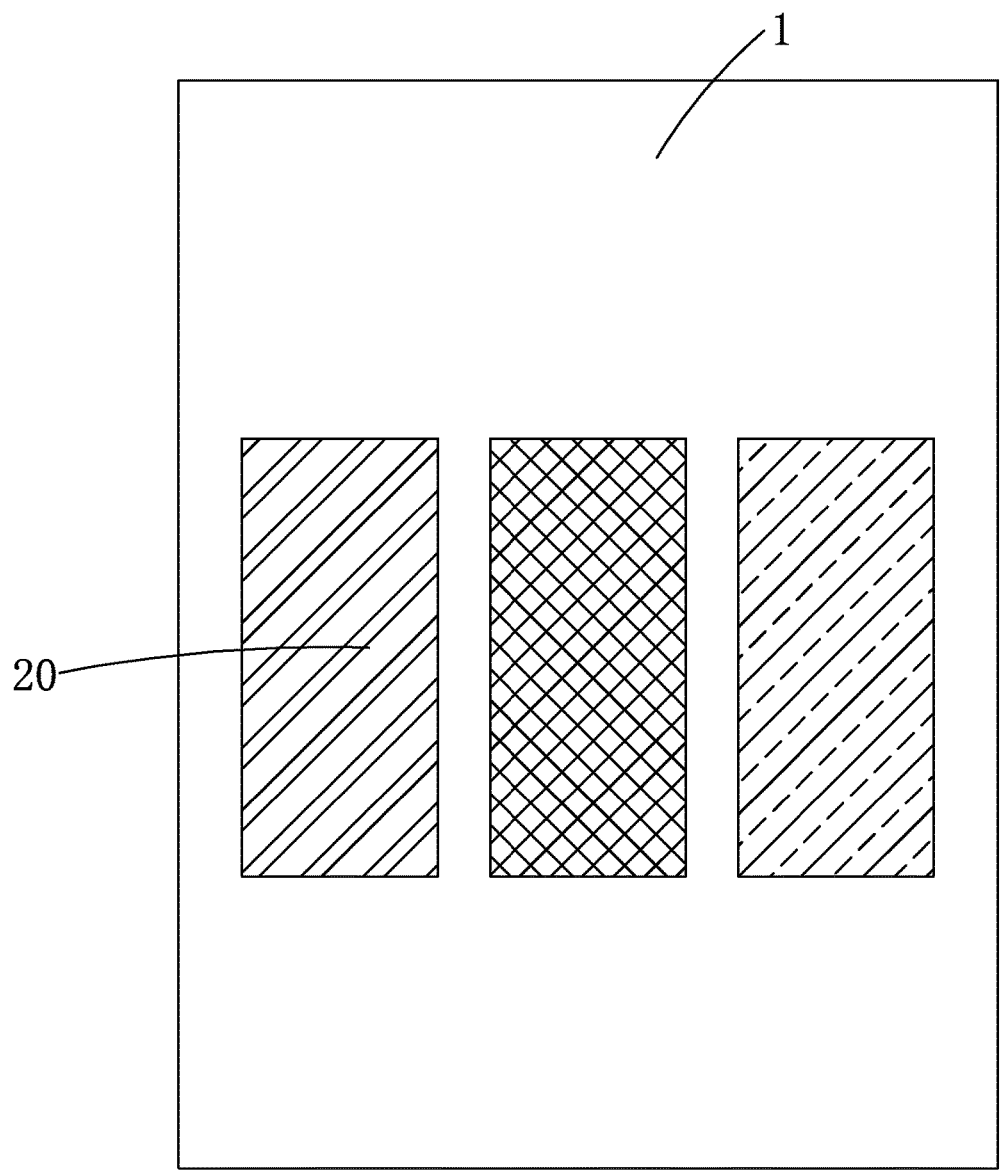
FIG. 2 is a top view showing a transparent OLED display panel provided by an embodiment of the present invention.
Figure 3:
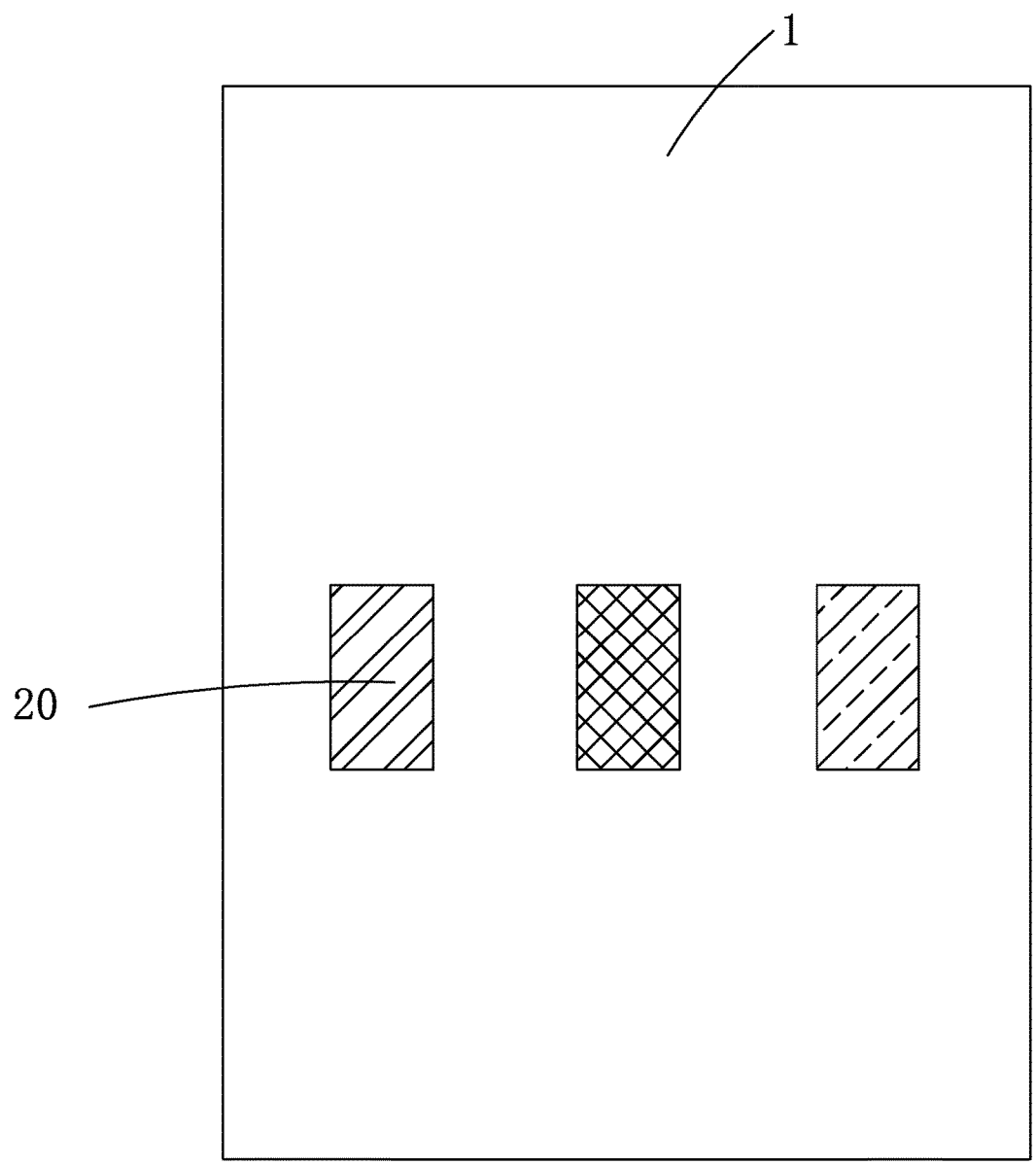
FIG. 3 is a bottom view showing a transparent OLED display panel provided by an embodiment of the present invention.
Figure 4:
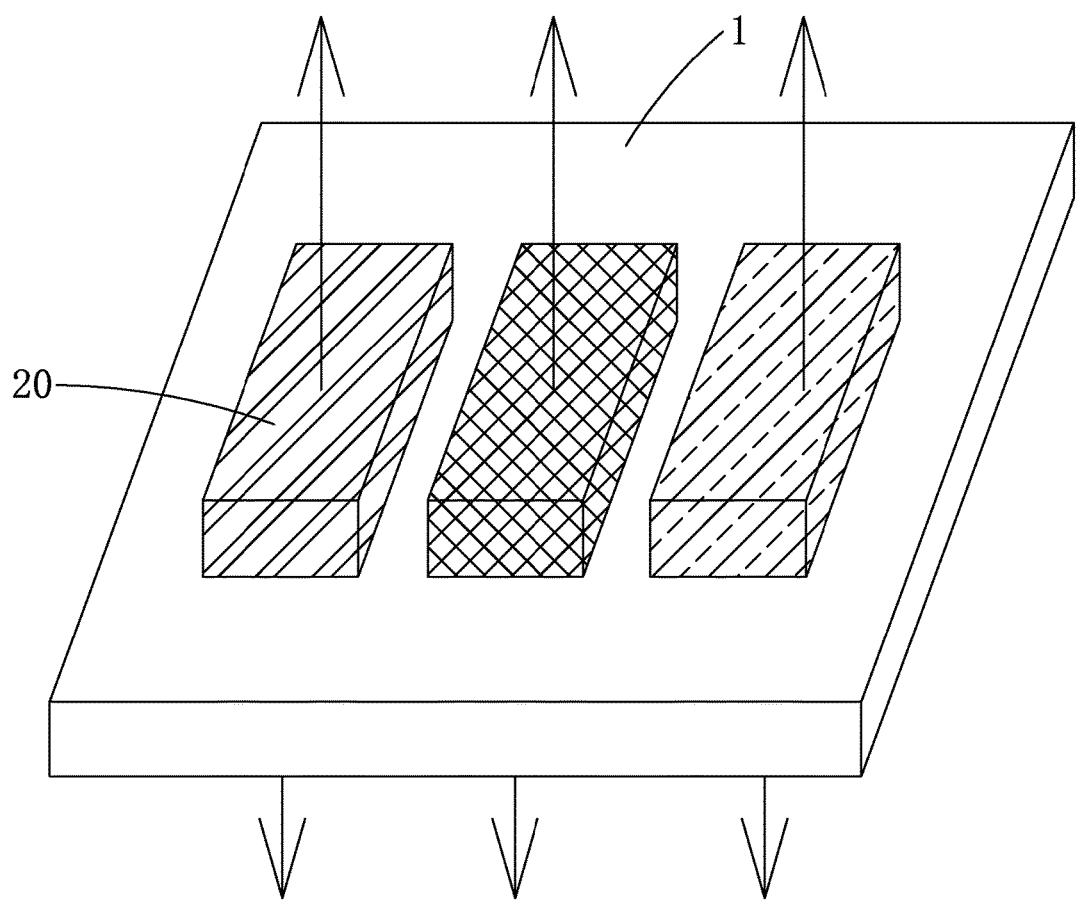
FIG. 4 is a 3D schematic view showing a transparent OLED display panel provided by an embodiment of the present invention.

Referring to FIG. 2 to FIG. 4, the present invention provides a transparent OLED display panel, comprising: a transparent substrate 1 and a plurality of sub-pixels 20 disposed on the substrate 1 arranged in an array;

Referring to FIG. 1, each sub-pixel 20 comprising: an anode 21 disposed on the substrate 1, an organic light-emitting layer 22 disposed on the anode 21, and a transparent cathode 23 disposed on the organic light-emitting layer 22;

the anode 21 comprising: a first transparent electrode 211, a reflective electrode 212 stacked on the first transparent electrode 211, a second transparent electrode 213 stacked on the reflective electrode 212, the reflective electrode 212 forming a hollow area 214 at the center.

Preferably, the first transparent electrode 211 and the second transparent electrode 212 are made of indium tin oxide (ITO), and the reflective electrode is made of silver (Ag).

Specifically, the shape of the hollow area 214 depends on the application requirements; preferably, the hollow area 214 has a round, rectangular, or centrically-symmetric polygon shape.

Moreover, to consider both the reflection effect of the reflective electrode 212 and the display effect of transparent display, the hollow area 214 preferably has a size smaller than or equal to ⅓ of the area of the sub-pixel 20.

Specifically, the plurality of sub-pixels 20 comprises: at least two different colors of sub-pixels 20, area ration between the hollow areas 214 of the at least two different colors of sub-pixels 20 is equal to the area ratio between the areas of the at least two different colors of sub-pixels 20.

For example, the plurality of sub-pixels 20 of the transparent OLED display panel comprises a plurality of red sub-pixels, a plurality of green sub-pixels, and a plurality of blue sub-pixels; and if the area ratio among the red sub-pixels, the green sub-pixels and the blue sub-pixels is 1:1:2, the ratio of the hollow areas 214 area of the red sub-pixels, the green sub-pixels, and the blue sub-pixels is also 1:1:2.

It should be noted that, as shown in FIG. 4, the present invention, by adding the hollow area 214 to the reflective electrode 212 so that the light emitted to the hollow are 214 through the second transparent electrode 213 is no longer reflected but continues through the first transparent electrode 211 to be emitted from the bottom of the substrate 1. The light emitted to the reflective electrode 212 is still reflected and emitted from the cathode 23 so as to realize transparent display. As such, the structure is simple and stable, and the yield is high and the production cost is low.

Figure 5:
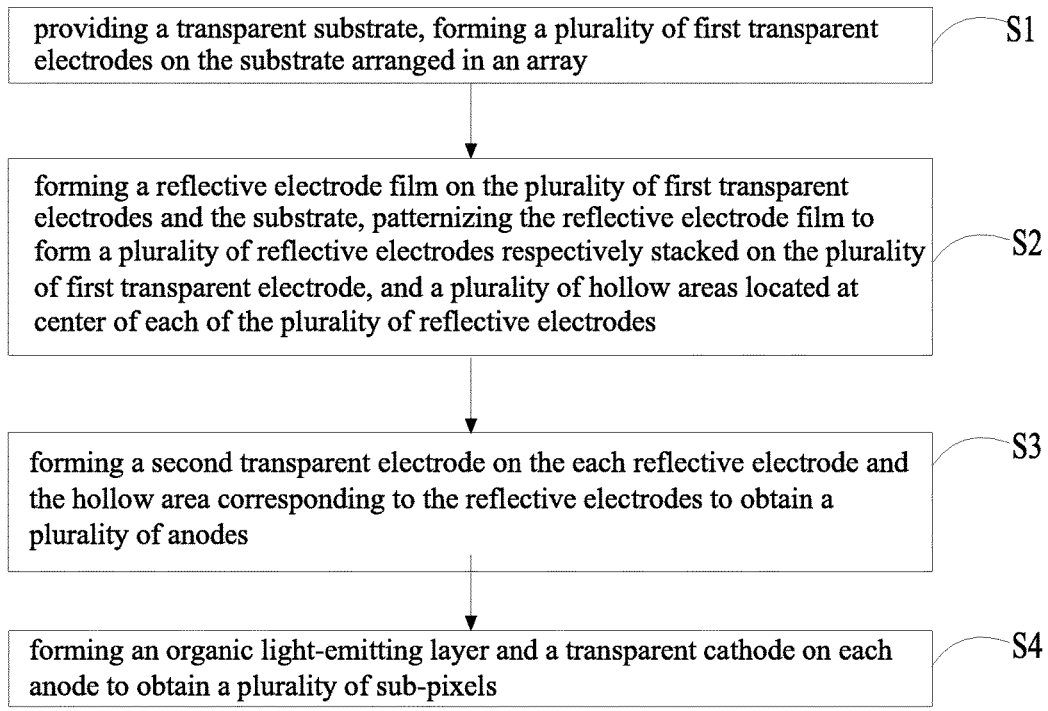
FIG. 5 is a schematic view showing a flowchart of the manufacturing method of transparent OLED display panel provided by an embodiment of the present invention.

Moreover, refer to FIG. 5, in combination with FIGS. 1-4, the present invention also provides a manufacturing method of transparent OLED display panel, comprising the steps of:

Step S1: providing a transparent substrate 1, forming a plurality of first transparent electrodes 211 on the substrate 1 arranged in an array.

Moreover, the step of forming a plurality of first transparent electrodes 211 specifically comprises: forming a transparent electrode film on the substrate 1, patternizing the transparent electrode film to obtain a plurality of first transparent electrode 211. Preferably, the substrate 1 is a glass substrate, and the first transparent electrode 211 is made of ITO.

Step S2: forming a reflective electrode film on the plurality of first transparent electrodes 211 and the substrate 1, patternizing the reflective electrode film to form a plurality of reflective electrodes 212 respectively stacked on the plurality of first transparent electrode 211, and a plurality of hollow areas 214 located at center of each of the plurality of reflective electrodes 212.

Preferably, the reflective electrode 212 is made of silver.

Specifically, the shape of the hollow area 214 depends on the application requirements; preferably, the hollow area 214 has a round, rectangular, or centrically-symmetric polygon shape.

Moreover, to consider both the reflection effect of the reflective electrode 212 and the display effect of transparent display, the hollow area 214 preferably has a size smaller than or equal to ⅓ of the area of the sub-pixel 20.

Step S3: forming a second transparent electrode 213 on the each reflective electrode 212 and the hollow area 214 corresponding to the reflective electrodes 212 to obtain a plurality of anodes 21.

Moreover, the step of forming a plurality of second transparent electrodes 213 specifically comprises: forming a transparent electrode film on the substrate 1, patternizing the transparent electrode film to obtain a plurality of second transparent electrode 213. Preferably, the second transparent electrode 213 is made of ITO.

Step S4: forming an organic light-emitting layer 22 and a transparent cathode 23 on each anode 21 to obtain a plurality of sub-pixels 20.

Specifically, the plurality of sub-pixels 20 comprises: at least two different colors of sub-pixels 20, area ration between the hollow areas 214 of the at least two different colors of sub-pixels 20 is equal to the area ratio between the areas of the at least two different colors of sub-pixels 20.

For example, the plurality of sub-pixels 20 of the transparent OLED display panel comprises a plurality of red sub-pixels, a plurality of green sub-pixels, and a plurality of blue sub-pixels; and if the area ratio among the red sub-pixels, the green sub-pixels and the blue sub-pixels is 1:1:2, the ratio of the hollow areas 214 area of the red sub-pixels, the green sub-pixels, and the blue sub-pixels is also 1:1:2.

It should be noted that, as shown in FIG. 4, the present invention, by adding the hollow area 214 to the reflective electrode 212 so that the light emitted to the hollow are 214 through the second transparent electrode 213 is no longer reflected but continues through the first transparent electrode 211 to be emitted from the bottom of the substrate 1. The light emitted to the reflective electrode 212 is still reflected and emitted from the cathode 23 so as to realize transparent display. As such, the structure is simple and stable, and the yield is high and the production cost is low.

In summary, the present invention provides a transparent OLED display panel, comprising: a transparent substrate and a plurality of sub-pixels disposed on the substrate arranged in an array; each sub-pixel comprising: an anode disposed on the substrate, an organic light-emitting layer disposed on the anode, and a transparent cathode disposed on the organic light-emitting layer; the anode comprising: a first transparent electrode, a reflective electrode stacked on the first transparent electrode, a second transparent electrode stacked on the reflective electrode, the reflective electrode forming a hollow area at the center; through forming hollow area on the reflective electrode of the anode, the light can be emitted simultaneously for the cathode and the hollow area to achieve transparent display with a simple and stable structure, high yield rate and low production cost. The present invention also provides a manufacturing method of transparent OLED display panel, able to simplify the production process of transparent OLED display device, improve yield rate of the transparent OLED display device, and reduce the production cost of transparent OLED display device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A transparent organic light-emitting diode (OLED) display panel, comprising: a transparent substrate and a plurality of sub-pixels disposed on the substrate arranged in an array;
   each sub-pixel comprising: an anode disposed on the substrate, an organic light-emitting layer disposed on the anode, and a transparent cathode disposed on the organic light-emitting layer;
   the anode comprising: a first transparent electrode, a reflective electrode stacked on the first transparent electrode, a second transparent electrode stacked on the reflective electrode, the reflective electrode forming a hollow area in a center thereof.

2. The transparent OLED display panel as claimed in claim 1, wherein the first transparent electrode and the second transparent electrode are made of indium tin oxide (ITO), and the reflective electrode is made of silver (Ag).

3. The transparent OLED display panel as claimed in claim 1, wherein the hollow area has a round, rectangular, or centrically-symmetric polygon shape.

4. The transparent OLED display panel as claimed in claim 1, wherein the hollow area has a size smaller than or equal to ⅓ of an area of the sub-pixel.

5. The transparent OLED display panel as claimed in claim 1, wherein the plurality of sub-pixels comprises: at least two different colors of sub-pixels, and an area ratio between the hollow areas of the at least two different colors of sub-pixels is equal to an area ratio between areas of the at least two different colors of sub-pixels.

6. A manufacturing method of transparent organic light-emitting diode (OLED) display panel, comprising the steps of:
  providing a transparent substrate, forming a plurality of first transparent electrodes on the substrate arranged in an array;
  forming a reflective electrode film on the plurality of first transparent electrodes and the substrate, patterning the reflective electrode film to form a plurality of reflective electrodes respectively stacked on the plurality of first transparent electrode, and a plurality of hollow areas located at center of each of the plurality of reflective electrodes;
  forming a second transparent electrode on the each reflective electrode and the hollow area corresponding to the reflective electrodes to obtain a plurality of anodes;
  forming an organic light-emitting layer and a transparent cathode on each anode to obtain a plurality of sub-pixels.

7. The manufacturing method of transparent OLED display panel as claimed in claim 6, wherein the first transparent electrode and the second transparent electrode are made of indium tin oxide (ITO), and the reflective electrode is made of silver (Ag).

8. The manufacturing method of transparent OLED display panel as claimed in claim 6, wherein the hollow area has a round, rectangular, or centrically-symmetric polygon shape.

9. The manufacturing method of transparent OLED display panel as claimed in claim 6, wherein the hollow area has a size smaller than or equal to 1/3 of an area of the sub-pixel.

10. The manufacturing method of transparent OLED display panel as claimed in claim 6, wherein the plurality of sub-pixels comprises: at least two different colors of sub-pixels, an area ratio between the hollow areas of the at least two different colors of sub-pixels is equal to an area ratio between areas of the at least two different colors of sub-pixels.

11. A transparent organic light-emitting diode (OLED) display panel, comprising: a transparent substrate and a plurality of sub-pixels disposed on the substrate arranged in an array;
  each sub-pixel comprising: an anode disposed on the substrate, an organic light-emitting layer disposed on the anode, and a transparent cathode disposed on the organic light-emitting layer;
  the anode comprising: a first transparent electrode, a reflective electrode stacked on the first transparent electrode, a second transparent electrode stacked on the reflective electrode, the reflective electrode forming a hollow area in a center thereof;
  wherein the first transparent electrode and the second transparent electrode are made of indium tin oxide (ITO), and the reflective electrode is made of silver (Ag);
  wherein the hollow area has a round, rectangular, or centrically-symmetric polygon shape;
  wherein the hollow area has a size smaller than or equal to 1/3 of an area of the sub-pixel;
  wherein the plurality of sub-pixels comprises: at least two different colors of sub-pixels, an area ratio between hollow areas of the at least two different colors of sub-pixels is equal to an area ratio between the areas of the at least two different colors of sub-pixels.

* * * * *